United States Patent
Chang et al.

(10) Patent No.: US 8,238,506 B2
(45) Date of Patent: Aug. 7, 2012

(54) PHASE-DISCRIMINATING DEVICE AND METHOD

(75) Inventors: Chieh-Fu Chang, Taipei (TW);
Ru-Muh Yang, Taipei (TW);
Ming-Seng Kao, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 875 days.

(21) Appl. No.: 12/349,141

(22) Filed: Jan. 6, 2009

(65) Prior Publication Data

US 2010/0171526 A1 Jul. 8, 2010

(51) Int. Cl.
*H03D 3/24* (2006.01)
*H04L 25/38* (2006.01)
*H04L 25/00* (2006.01)
*H04L 7/00* (2006.01)
*H04L 25/40* (2006.01)
*H03L 7/00* (2006.01)

(52) U.S. Cl. ........ 375/375; 375/373; 375/371; 375/354; 327/141

(58) Field of Classification Search .................... 375/375
See application file for complete search history.

(56) References Cited

U.S. PATENT DOCUMENTS

| | | | | |
|---|---|---|---|---|
| 5,999,561 | A * | 12/1999 | Naden et al. ................... | 375/142 |
| 2004/0247056 | A1 * | 12/2004 | Demir et al. ................... | 375/345 |
| 2006/0183451 | A1 * | 8/2006 | Demir et al. ................... | 455/232.1 |
| 2006/0239179 | A1 * | 10/2006 | Berkeman et al. ............. | 370/208 |
| 2009/0116586 | A1 * | 5/2009 | Arambepola et al. ......... | 375/324 |
| 2009/0268101 | A1 * | 10/2009 | Shukla et al. .................. | 348/729 |

OTHER PUBLICATIONS

C.-F. Chang, R.-M. Yang and M.-S. Kao, "Implementation of an Innovative Phase Discriminator for Improved Tracking Performance in One-Bit Software GPS Receiver," Proceedings of ION NTM 2008, San Diego, Jan. 28-30, 2008.
C.-F. Chang and M.-S. Kao, "High-Accuracy Carrier Phase Discriminator in One-Bit Quantized Software-Defined Receivers," IEEE Signal Processing Letter, vol. 15, pp. 397-400, 2008.

* cited by examiner

*Primary Examiner* — David C. Payne
*Assistant Examiner* — Erin File
(74) *Attorney, Agent, or Firm* — Volpe and Koenig, P.C.

(57) ABSTRACT

A high-accuracy and computational efficient phase-discriminating device is provided and includes a phase-discriminating unit. The phase-discriminating unit converts an input and a reference signals into an input and a reference sequences respectively by a one-bit A/D conversion operation, determines a first value, an in-phase component and a quadrature component of the input signal in response to the input and the reference sequences, and produces an estimated phase of the input signal according to a relation among the first value, the in-phase component and a polarity of the quadrature component, wherein the first value is a certain integer being one of a first integer and a second integer, the first integer is a sampling count of the one-bit A/D conversion operation for producing the input sequence, and the second integer is a summation of an absolute value of the in-phase component and that of the quadrature component.

20 Claims, 10 Drawing Sheets

PHASE-DISCRIMINATING DEVICE AND METHOD

FIELD OF THE INVENTION

The present invention relates to a phase-discriminating device and method, and more particularly to a phase-discriminating device and method for applying to a radio frequency receiving system.

BACKGROUND OF THE INVENTION

Please refer to FIG. 1, which is a schematic diagram showing a conventional arctangent phase-discriminating (APD) device. As shown, the APD device 10 includes a local oscillator 11, two multiplication circuits 121 and 122, two integration circuit 131 and 132, and a phase-estimating unit 14. The APD device 10 receives an input signal $S_1$ and produces an estimated phase $\hat{\theta}_1$ of the input signal $S_1$, wherein the input signal $S_1$ has a carrier frequency $f_C$ and a phase $\theta_1$. For instance, the input signal $S_1$ may be expressed as $\{E_1 \cos(2pf_Ct+\theta_1)+n_1(t)\}$, wherein $E_1$ is the signal amplitude, $n_1(t)$ is the added Gaussian noise, and t is the time.

The local oscillator 11 produces an in-phase reference wave $R1_I$ and a quadrature reference wave $R1_Q$. The in-phase reference wave $R1_I$ may be expressed as $\cos(2pf_Ct)$. The quadrature reference wave $R1_Q$ has 90° (p/2 radians) out of phase in comparison with the in-phase reference wave $R1_I$, and may be expressed as $\sin(2pf_Ct)$. The multiplication circuit 121 receives the input signal $S_1$ and the in-phase reference wave $R1_I$, and multiplies the input signal S1 by the in-phase reference wave $R1_I$ to produce a signal $SR_I$. The multiplication circuit 122 receives the input signal $S_1$ and the quadrature reference wave $R1_Q$, and multiplies the input signal $S_1$ by the quadrature reference wave $R1_Q$ to produce a signal $SR_Q$.

The integration circuit 131 receives the signal $SR_I$, and integrates the signal $SR_I$ for a certain time interval to produce an in-phase component $I_A$ of the input signal $S_1$, wherein the in-phase component $I_A$ may be an estimate of ($E_1 \cos \theta_1$). The integration circuit 132 receives the signal $SR_Q$, and integrates the signal $SR_Q$ for the certain time interval to produce a quadrature component $Q_A$ of the input signal $S_1$, wherein the quadrature component $Q_A$ may be an estimate of ($E_1 \sin \theta_1$). In a conventional scheme, the integration circuits 131 and 132 process the signals $SR_I$ and $SR_Q$ by a multiple-bit A/D conversion operation to respectively produce the in-phase component $I_A$ and the quadrature component $Q_A$.

The phase-estimating unit 14 receives the in-phase component $I_A$ and the quadrature component $Q_A$, and performs an arctangent operation $\tan^{-1}(Q_A/I_A)$ to produce the estimated phase $\hat{\theta}_1$.

However, the arctangent operation $\tan^{-1}(Q_A/I_A)$ is complex due to the nonlinear form, and thus performing the arctangent operation $\tan^{-1}(Q_A/I_A)$ requires heavy computation storage, additional power consumption and automatic gain control. Therefore, it is necessary to improve the disadvantages of the APD device 10.

SUMMARY OF THE INVENTION

It is an object of the present invention to provide a phase-discriminating device and method, which is developed based on the digital perspective for a one-bit ADC processing receiver. In noiseless or high signal-to-noise ratio (SNR) environments, the present phase-discriminating device of the present invention achieves high accuracy than that of the typical arctangent phase-discriminating (APD) device up to several orders with sufficient samples since the accuracy of the APD device is bounded due to quantization loss. The present phase-discriminating device also has the high accuracy property in noiseless (or high SNR) environments and the noise robust property. The complexity and the computation load of the present phase-discriminating device are much less than those of the conventional APD device, and the feasibility in the one-bit processing receiver is very attractive due to avoidance of the automatic gain control (AGC), the efficient bit-wise processing and the cost-down implementation, such as the gate count reduction and the simple one-bit operation design, in the field programmable gate array (FPGA) and the application-specific integrated circuit (ASIC). The present phase-discriminating device is widely implemented in the fields of the communication, the digital signal processing, the software-defined receiver, the sensor-network, the position and the navigation.

It is therefore a first aspect of the present invention to provide a phase-discriminating device including a phase-discriminating unit. The phase-discriminating unit converts an input and a reference signals into an input and a reference sequences respectively by a one-bit A/D conversion operation, determines a first value, an in-phase component and a quadrature component of the input signal in response to the input and the reference sequences, and produces an estimated phase of the input signal according to a relation among the first value, the in-phase component and a polarity of the quadrature component, wherein the first value is a certain integer being one of a first integer and a second integer, the first integer is a sampling count of the one-bit A/D conversion operation for producing the input sequence, and the second integer is a summation of an absolute value of the in-phase component and that of the quadrature component.

It is therefore a second aspect of the present invention to provide a phase-discriminating device including a phase-discriminating unit. The phase-discriminating unit processes an input signal by a one-bit A/D conversion operation to determine a first value, an in-phase component and a quadrature component of the input signal, and produces an estimated phase of the input signal according to a relation among the first value, the in-phase component and a polarity of the quadrature component.

It is therefore a third aspect of the present invention to provide a phase-discriminating method including the following steps. An input signal is processed through a one-bit A/D conversion operation to determine a first value, an in-phase component and a quadrature component of the input signal; and an estimated phase of the input signal is produced according to a relation among the first value, the in-phase component and a polarity of the quadrature component.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
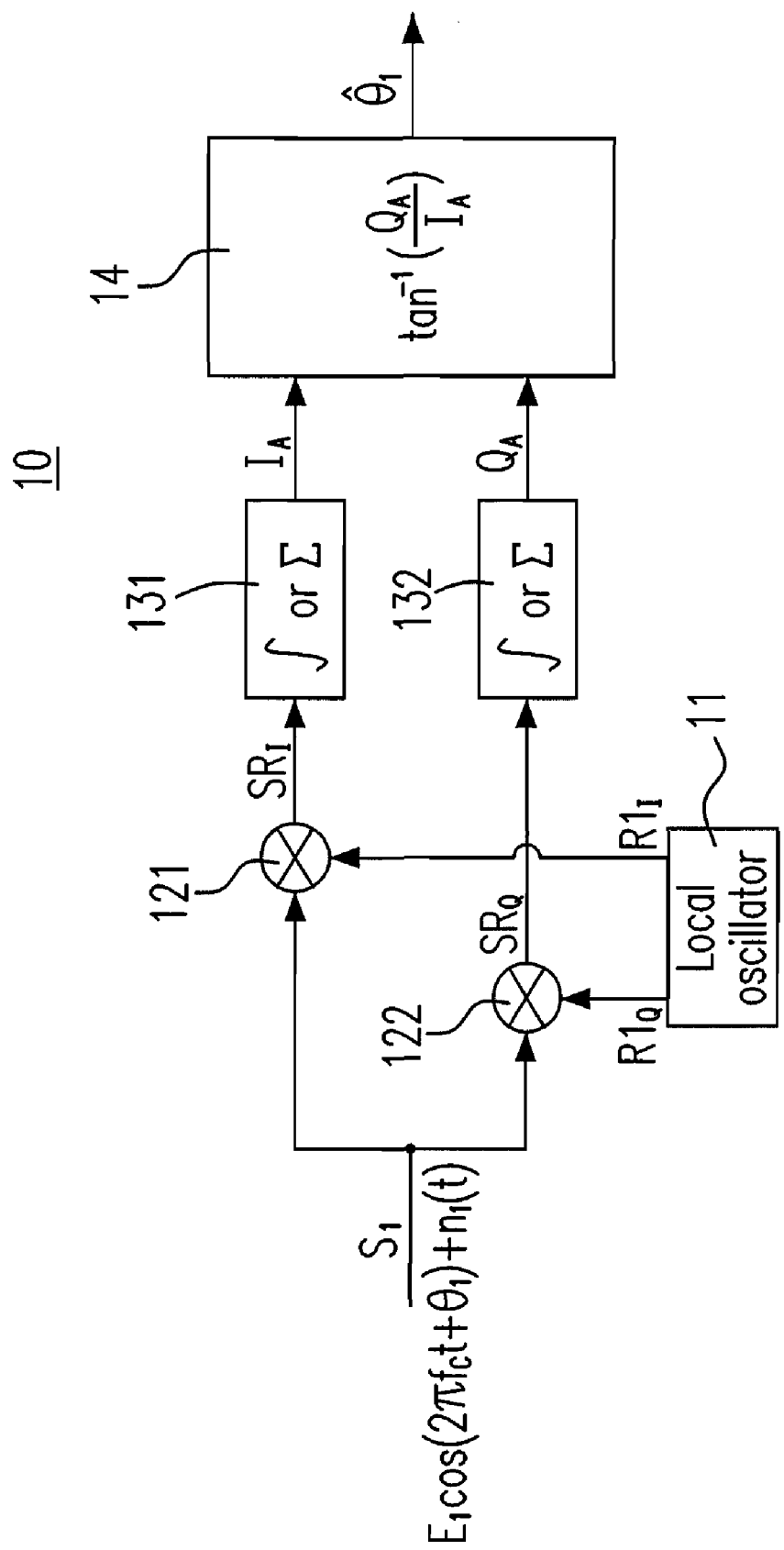
FIG. 1 is a schematic diagram showing a conventional APD device.
Figure 2:
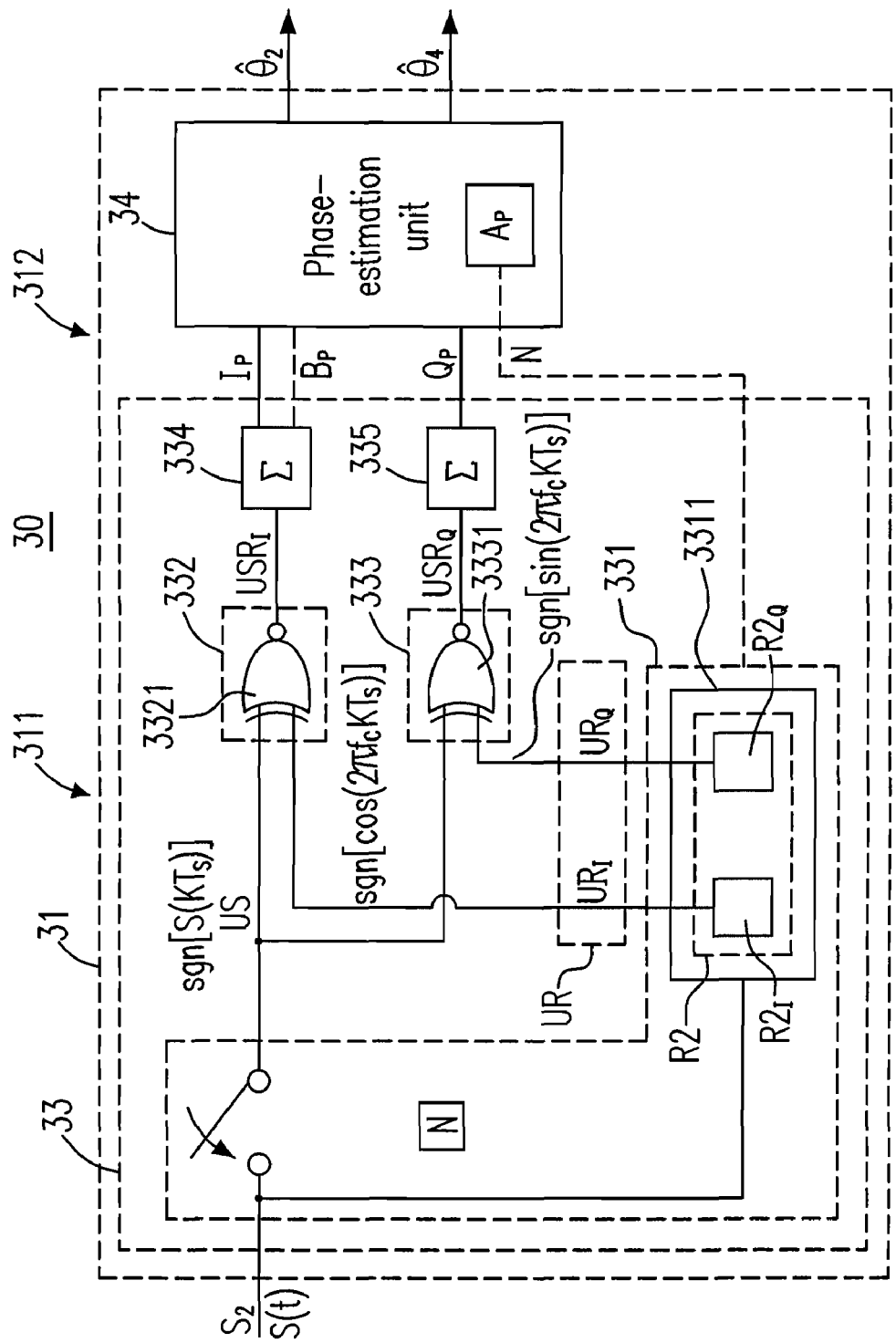
FIG. 2 is a schematic diagram showing a phase-discriminating device of the present invention.

Please refer to FIG. 2, which is a schematic diagram showing a phase-discriminating device 30 of the present invention. As shown, the phase-discriminating device 30 includes a phase-discriminating unit 31. The phase-discriminating unit 31 receives an input signal $S_2$ and produces an estimated phase $\hat{\theta}_2$ (or $\hat{\theta}_4$ in another embodiment) of the input signal $S_2$, wherein the input signal $S_2$ has a carrier frequency $f_C$ and a phase $\theta_2$. For instance, the input signal $S_2$ may be expressed as the signal $S(t)=E_2 \cos(2\pi f_C t+\theta_2)+n_2(t)$, wherein $E_2$ is the signal amplitude, $n_2(t)$ is the added Gaussian noise, $t$ is the time, and $E_2$ and $\theta_2$ may be functions of the time t.

In an embodiment, the phase-discriminating unit 31 receives the input signal $S_2$, processes the input signal $S_2$ by a one-bit analog-to-digital (A/D) conversion operation to determine a value $A_P$, an in-phase component $I_P$ and a quadrature component $Q_P$ of the input signal $S_2$, and produces the estimated phase $\hat{\theta}_2$ of the input signal $S_2$ according to a relation among the value $A_P$, the in-phase component $I_P$ and a polarity of the quadrature component $Q_P$.

In the above embodiment, the phase-discriminating unit 31 determines a reference signal R2 according to the input signal $S_2$, converts the input signal $S_2$ and the reference signal R2 into an input sequence US and a reference sequence UR respectively by the one-bit A/D conversion operation, and determines the value $A_P$, the in-phase component $I_P$ and the quadrature component $Q_P$ in response to the input sequence US and the reference sequence UR, wherein the relation is a formula $(\text{sgn}[Q_P] \cdot (1-I_P/A_P)/2)$, and the $\text{sgn}[Q_P]$ denotes a polarity function, e.g. $\text{sgn}[x]=1$ if $x=0$ and $\text{sgn}[x]=-1$ if $x<0$. The value $A_P$ may be a certain integer being one of a first integer and a second integer, wherein the first integer is a sampling count N of the one-bit A/D conversion operation for producing the input sequence US, and the second integer is a summation of an absolute value of the in-phase component $I_P$ and that of the quadrature component $Q_P$.

The reference signal R2 includes an in-phase reference wave $R2_I$ and a quadrature reference wave $R2_Q$. When the input signal $S_2$ is expressed in the form $S(t)=E_2 \cos(2\pi f_C t+\theta_2)+n_2(t)$, the in-phase reference wave $R2_I$ may be expressed as a cosine wave $\cos(2\pi f_C t)$, and the quadrature reference wave $R2_Q$ may be expressed as a sine wave $\sin(2\pi f_C t)$. When the input signal $S_2$ is expressed in the form $W(t)=E_3 \sin(2\pi f_C t+\theta_3)+n_3(t)$, the in-phase reference wave $R2_I$ may be expressed as the sine wave $\sin(2\pi f_C t)$, and the quadrature reference wave $R2_Q$ may be expressed as the cosine wave $\cos(2\pi f_C t)$, wherein $E_3$ is the signal amplitude, $n_3(t)$ is the added Gaussian noise, $\theta_3$ is the phase. The descriptions given below take the input signal $S_2$ expressed in the form $S(t)=E_2 \cos(2\pi f_C t+\theta_2)+n_2(t)$ as examples.

The value $A_P$ may be associated with a signal-to-noise ratio (SNR) of the input signal $S_2$. In an embodiment, the formula $(\text{sgn}[Q_P] \cdot (1-I_P/A_P)/2)$ is applied to the first condition that the signal-to-noise ratio is high, e.g. larger than 10 dB; under the first condition, the value $A_P$ is an integer being a sampling count N of the one-bit A/D conversion operation for producing the input sequence US; the phase-discriminating unit 31 forms a digital phase-discriminating (DPD) configuration 311. In an embodiment, the formula $(\text{sgn}[Q_P] \cdot (1-I_P/A_P)/2)$ is applied to the second condition that the signal-to-noise ratio is low (e.g. an SNR less than 10 dB); under the second condition, the value $A_P$ is an integer being a summation of an absolute value of the $I_P$ and that of the $Q_P$; the phase-discriminating unit 31 forms a noise-balanced digital phase-discriminating (NB-DPD) configuration 312.

The DPD configuration 311 includes a determining unit 33 and a phase-estimating unit 34. The determining unit 33 converts the input signal $S_2$ (e.g. $S(t)$) and the reference signal R2 into the input sequence US (e.g. $\text{sgn}[S(kT_S)]$, $k=0, 1, \ldots, N-1$, where k is the sampling serial number and $T_S$ is the sampling period) and the reference sequence UR respectively by the one-bit A/D conversion operation, and determines the value $A_P$ (i.e. the sampling count N), the in-phase component $I_P$ and the quadrature component $Q_P$ in response to the input sequence US and the reference sequence UR.

The reference sequence UR includes an in-phase reference sequence $UR_I$ (e.g. $\text{sgn}[\cos(2\pi f_C kT_S)]$) and a quadrature reference sequence $UR_Q$ (e.g. $\text{sgn}[\sin(2\pi f_C kT_S)]$). Each of the input sequence US, the in-phase reference sequence $UR_I$ and the quadrature reference sequence $UR_Q$ has a high and a low bit values being 1 and −1 respectively. The determining unit 33 of the DPD configuration 311 includes an A/D converter 331, two multiplication circuits 332 and 333, and two counter devices 334 and 335.

The A/D converter 331 of the DPD configuration 311 receives the input signal $S_2$, determines the reference signal R2 according to the input signal $S_2$, and sampling the input signal $S_2$, the in-phase reference wave $R2_I$ and the quadrature reference wave $R2_Q$ by a number of times equal to the sampling count N of the one-bit A/D conversion operation to respectively produce the input sequence US, the in-phase reference sequence $UR_I$ and the quadrature reference sequences $UR_Q$. The value $A_P$ equal to the sampling count N is provided to the phase-estimating unit 34 for calculating the estimated phase $\hat{\theta}_2$. The A/D converter 331 includes a numerical control oscillator 3311. The numerical control oscillator 3311 receives the input signal $S_2$, determines the reference signal R2, and produces the reference sequence UR. In an embodiment, the numerical control oscillator 3311 converts the reference signal R2 into the reference sequence UR beforehand, stores the reference sequence UR in a table, and provides the reference sequence UR from the table when the phase $\theta_2$ is discriminated.

The multiplication circuit 332 receives the input sequence US and the in-phase reference sequence $UR_I$, multiplies the input sequence US by the in-phase reference sequence $UR_I$ to produce a sequence $USR_I$ having corresponding bit values.

The multiplication circuit 332 may include an XOR gate 3321, which produces the sequence $USR_I$ in response to the input sequence US and the in-phase reference sequence $UR_I$. The multiplication circuit 333 receives the input sequence US and the quadrature reference sequence $UR_Q$, multiplies the input sequence US by the quadrature reference sequence $UR_Q$ to produce a sequence $USR_Q$ having corresponding bit values. The multiplication circuit 333 may include an XOR gate 3331, which produces the sequence $USR_I$ in response to the input sequence US and the quadrature reference sequence $UR_Q$.

The counter device 334 receives the sequence $USR_I$, and accumulates the corresponding bit values of the sequence $USR_I$ to produce the in-phase component $I_P$, e.g. which is an estimate of $E_2\cos(\theta_2)$. The counter device 335 receives the sequence $USR_Q$, and accumulates the corresponding bit values of the sequence $USR_Q$ to produce the quadrature component $Q_P$, e.g. which is an estimate of $E_2\sin(\theta_2)$.

The phase-estimating unit 34 of the DPD configuration 311 electrically connected to the determining unit 33, receives the value $A_P$, the in-phase component $I_P$ and the quadrature component $Q_P$, calculates a value of the formula $(\text{sgn}[Q_P]\cdot(1-I_P/A_P)/2)$, and multiplies the value by p to produce the estimated phase $\hat{\theta}_2=\text{sgn}[Q_P]\cdot(1-I_P/A_P)p/2$ in radian.

The formula $(\text{sgn}[Q_P]\cdot(1-I_P/A_P)/2)$ for the DPD configuration 311 may be equivalent to a formula $(\text{sgn}[Q_P]\cdot(B_P/A_P))$, wherein the $B_P$ is an amount of the low bit value in the sequence $USR_I$. The counter device 334 may further produce the $B_P$ being an integer. The phase-estimating unit 34 receives the value $A_P$, the $B_P$ and the quadrature component $Q_P$, calculates a value of the formula $(\text{sgn}[Q_P]\cdot(B_P/A_P))$, and multiplies the value by p to produce the estimated phase $\hat{\theta}_2=(\text{sgn}[Q_P]\cdot(B_P/A_P)p)$ of the input signal $S_2$ in radian.

The NB-DPD configuration 312 includes a determining unit 33 and a phase-estimating unit 34. The determining unit 33 converts the input signal $S_2$ and the reference signal R2 into the input sequence US and the reference sequence UR respectively by the one-bit A/D conversion operation, and determines the in-phase component $I_P$ and the quadrature component $Q_P$ in response to the input sequence US and the reference sequence UR. The determining unit 33 of the NB-DPD configuration 312 includes an A/D converter 331, two multiplication circuits 332 and 333, and two counter devices 334 and 335.

The A/D converter 331 of the NB-DPD configuration 312 receives the input signal $S_2$, determines the reference signal R2 according to the input signal $S_2$, and sampling the input signal $S_2$, the in-phase reference wave $R2_I$ and the quadrature reference wave $R2_Q$ by a number of times equal to the sampling count N of the one-bit A/D conversion operation to respectively produce the input sequence US, the in-phase reference sequence $UR_I$ and the quadrature reference sequences $UR_Q$. The multiplication circuits 332 and 333 of the NB-DPD configuration 312 are the same as the multiplication circuits 332 and 333 of the DPD configuration 311.

The counter device 334 of the NB-DPD configuration 312 receives the sequence $USR_I$, and accumulates the corresponding bit values of the sequence $USR_I$ to produce the in-phase component $I_P$, e.g. which is an estimate of $E_2\cos(\theta_2)$. The counter device 335 receives the sequence $USR_Q$, and accumulates the corresponding bit values of the sequence $USR_Q$ to produce the quadrature component $Q_P$, e.g. which is an estimate of $E_2\sin(\theta_2)$. The phase-estimating unit 34 of the NB-DPD configuration 312 electrically connected to the determining unit 33, receives the in-phase component $I_P$ and the quadrature component $Q_P$, calculates the value $A_P(A_P=|I_P|+|Q_P|)$ and a value of the formula $(\text{sgn}[Q_P]\cdot(1-I_P/A_P)/2)$, and multiplies the value of the formula $(\text{sgn}[Q_P]\cdot(1-I_P/A_P)/2)$ by p to produce the estimated phase $\hat{\theta}_4=\text{sgn}[Q_P]\cdot(1-I_P/A_P)p/2$ of the input signal $S_2$ in radian.

Figure 3:
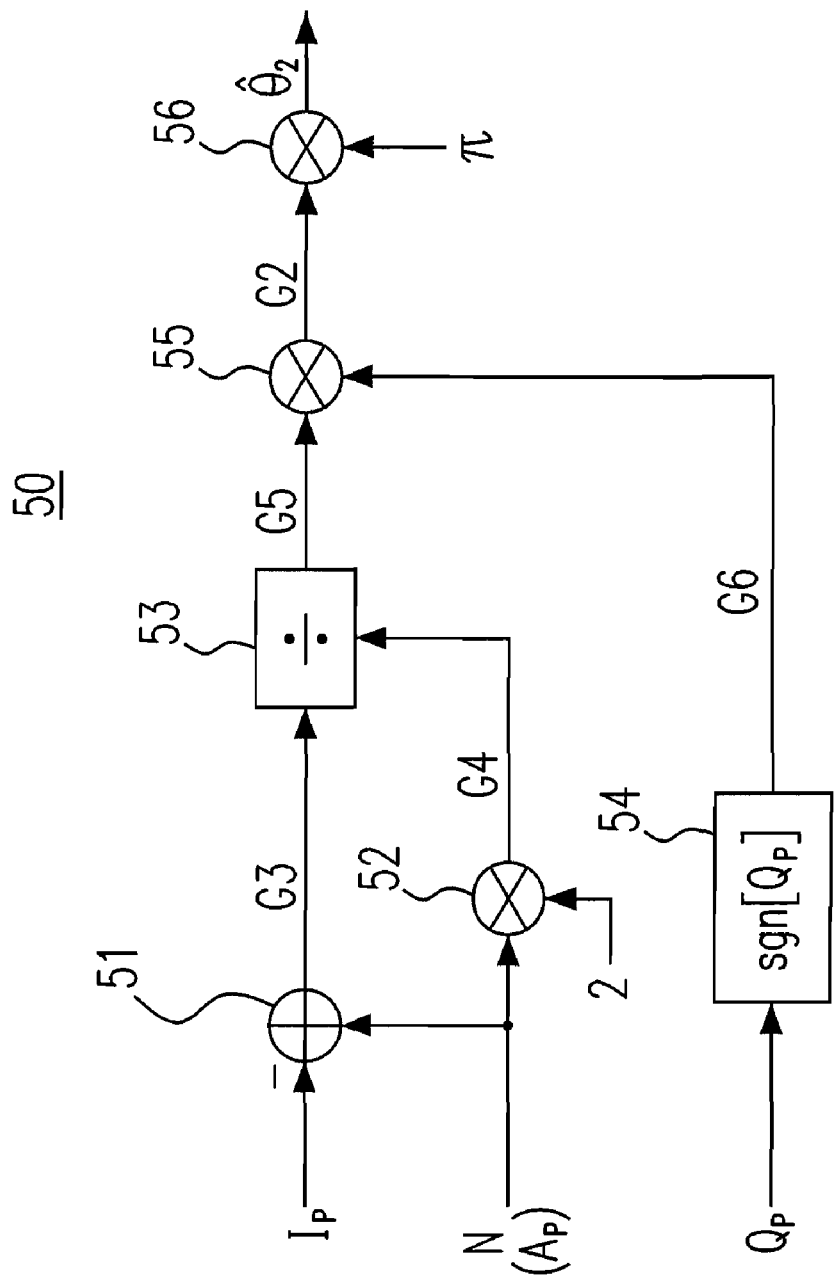
FIG. 3 is a schematic diagram showing a phase-estimating unit according to a digital phase-discriminating (DPD) configuration 311 in FIG. 2.

Please refer to FIG. 3, which is a schematic diagram showing a phase-estimating unit 50 according to the DPD configuration 311 in FIG. 2. As shown, the phase-estimating unit 50, being a detailed circuit of the phase-estimating unit 34 of the DPD configuration 311, includes an addition circuit 51, a division circuit 53, a polarity determining circuit 54 and three multiplication circuits 52, 55 and 56.

The addition circuit 51 receives the in-phase component $I_P$ and the sampling count N (i.e. the value $A_P$) from the determining unit 33, and subtracts the in-phase component $I_P$ from the sampling count N to produce a value G3. The multiplication circuit 52 receives the sampling count N, and multiplies the sampling count N by 2 to produce a value G4. The division circuit 53 receives the value G3 and the value G4, and divides the value G3 by the value G4 to produce a value G5. The polarity determining circuit 54 receives the quadrature component $Q_P$, and produces a value G6 of the $\text{sgn}[Q_P]$. The multiplication circuit 55 receives the value G5 and the value G6, and multiplies the value G5 by the value G6 to produce a value G2 of the formula $(\text{sgn}[Q_P]\cdot(1-I_P/A_P)/2)$. The multiplication circuit 56 receives the value G2, and multiplies the value G2 by p to produce the estimated phase $\hat{\theta}_2$. Because the value G2 is proportional to the estimated phase $\hat{\theta}_2$ by the constant p, the value G2 can represent the estimated phase $\hat{\theta}_2$ from the application viewpoint, so that the multiplication circuit 56 can be omitted.

Figure 4:
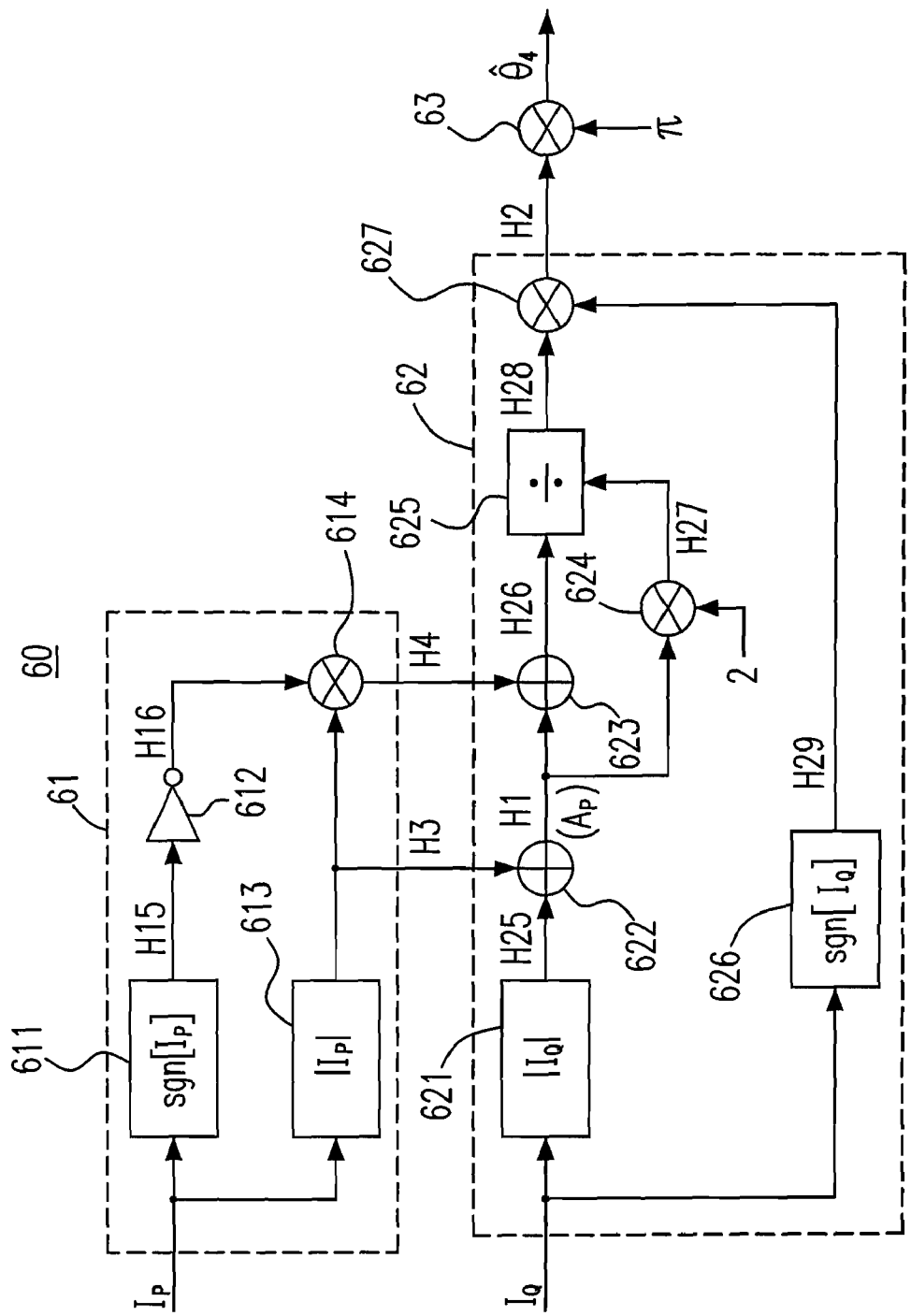
FIG. 4 is a schematic diagram showing a phase-estimating unit according to a noise-balanced digital phase-discriminating (NB-DPD) configuration in FIG. 2.

Please refer to FIG. 4, which is a schematic diagram showing a phase-estimating unit 60 according to the NB-DPD configuration 312 in FIG. 2. As shown, the phase-estimating unit 60, being a detailed circuit of the phase-estimating unit 34 of the NB-DPD configuration 312, includes two operation circuits 61 and 62 and a multiplication circuit 63. The operation circuit 61 produces a value H3 and a value H4 in response to the in-phase component $I_P$. The operation circuit 62 produces a value H2 of the formula $(\text{sgn}[Q_P]\cdot(1-I_P/A_P)/2)$ in response to the quadrature component $I_Q$, the value H3 and the value H4. The multiplication circuit 63 receives the value H2, and multiplies the value H2 by p to produce the estimated phase $\hat{\theta}_4$. Because the value H2 is proportional to the estimated phase $\hat{\theta}_4$ by the constant p, the value H2 can represent the estimated phase $\hat{\theta}_4$ from the application viewpoint, so that the multiplication circuit 63 can be omitted.

The operation circuit 61 includes a polarity determining circuit 611, an NOT gate 612, an absolute-value determining circuit 613 and a multiplication circuit 614. The polarity determining circuit 611 receives the in-phase component $I_P$, and produces a value H15 of the $\text{sgn}[I_P]$. The NOT gate receives the value H15, and producing a value H16 being $((-1)\cdot H15)$. The absolute-value determining circuit 613 receives the in-phase component $I_P$, and calculates an absolute value of the in-phase component $I_P$ to produce the value H3. The multiplication circuit 614 receives the value H3 and the value H16, and multiplies the value H3 by the value H16 to produce the value H4.

The operation circuit 62 includes an absolute-value determining circuit 621, two addition circuits 622 and 623, two multiplication circuits 624 and 627, a division circuit 625 and a polarity determining circuit 626. The absolute-value determining circuit 621 receives the quadrature component $Q_P$, and calculates an absolute value of the quadrature component $Q_P$ to produce a value H25. The addition circuit 622 receives the value H3 and the value H25, and adds the value H3 and the value H25 to produce a value H1 (equal to the value $A_P=|I_P|+|Q_P|$). The addition circuit 623 receives the value H4 and the value H1, and adds the value H4 and the value H1 to produce a value H26. The multiplication circuit 624 receives the value H1, and multiplies the value H1 by 2 to produce a value H27. The division circuit 625 receives the value H26 and the value H27, and dividing the value H26 by the value H27 to produce a value H28. The polarity determining circuit 626 receives the quadrature component $Q_P$, and produces a value H29 of the sgn[$Q_P$]. The multiplication circuit 627 receives the value H28 and the value H29, and multiplies the value H28 by the value H29 to produce the value H2 of the formula (sgn[$Q_P$]· $(1-I_P/A_P)/2$).

Figure 5:
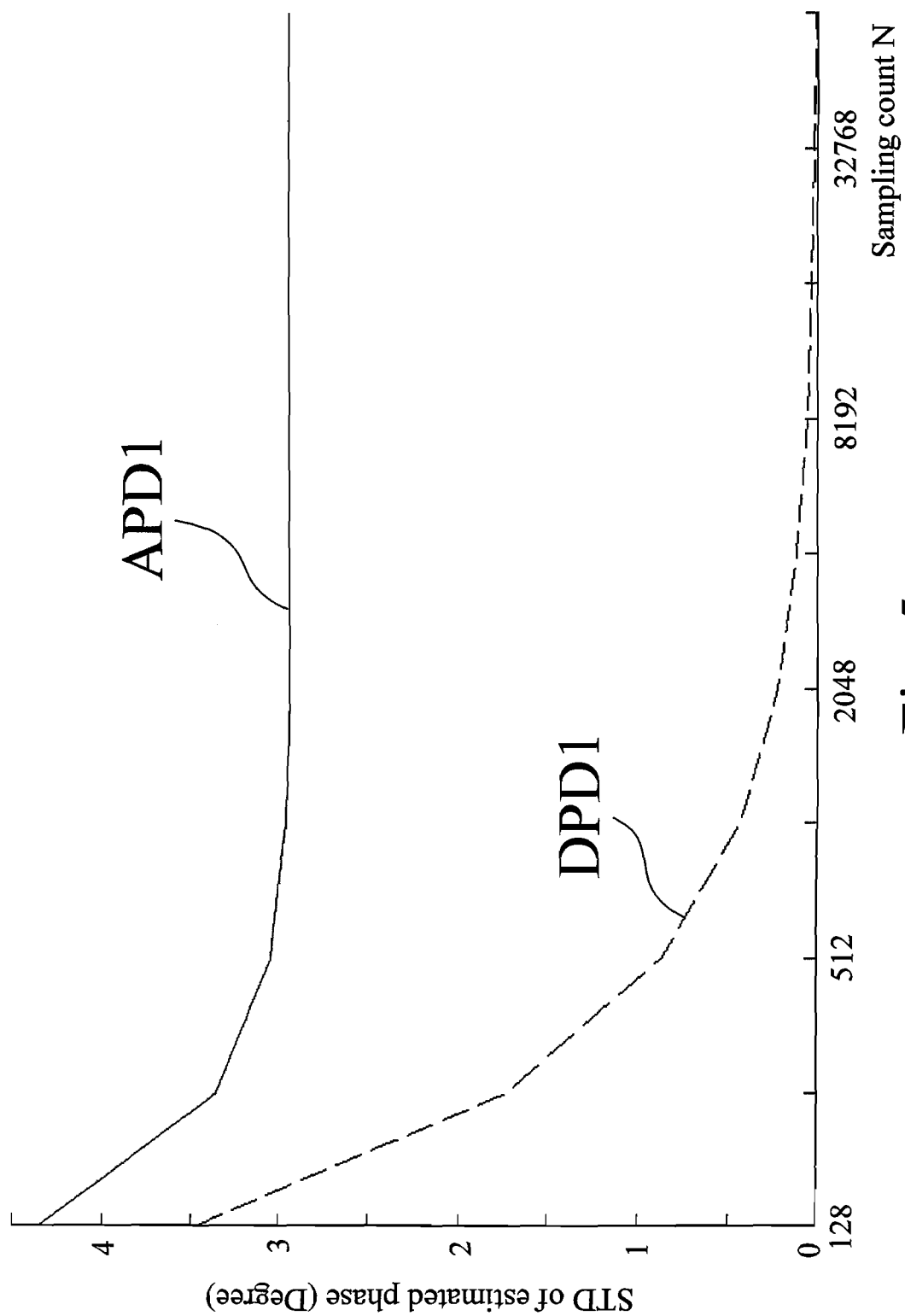
FIG. 5 is a schematic diagram showing changes of standard deviations of estimated phases in degree obtained from the APD device and the DPD configuration for a change of a sampling count.

Please refer to FIG. 5, which is a schematic diagram showing changes of standard deviations (STDs) of the estimated phases in degree obtained from the APD device 10 and the DPD configuration 311 for a change of a sampling count N. As shown, the STD curve APD1 is obtained from the APD device 10, and the STD curve DPD1 is obtained from the DPD configuration 311. The STD of the estimated phase of the APD device 10 is almost independent of the sampling count N when N=512. In contrast, the STD of the estimated phase of the DPD configuration 311 constantly decreases as the sampling count N increases. It means that the accuracy of the APD device 10 is bounded, and that of the DPD configuration 311 can attain several orders of improvement when the sampling count N keeps increasing.

Figure 6A:
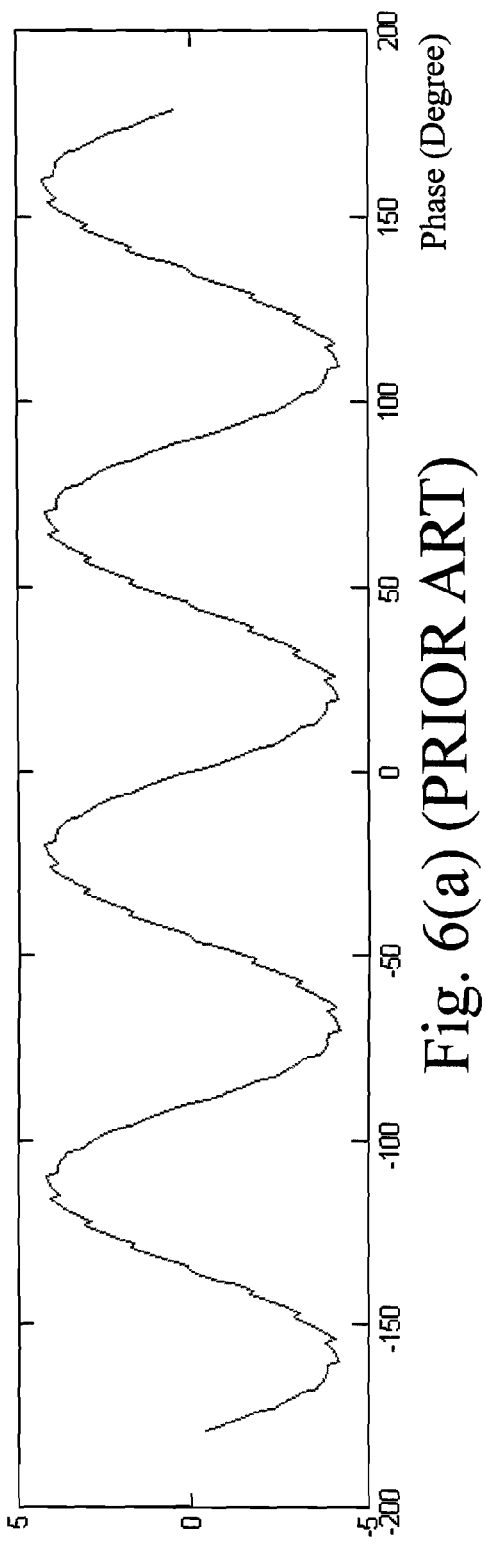
FIG. 6(a) is a schematic diagram showing a change of a phase-estimate error in degree obtained from the APD device according to a change of a phase of an input signal.
Figure 6B:
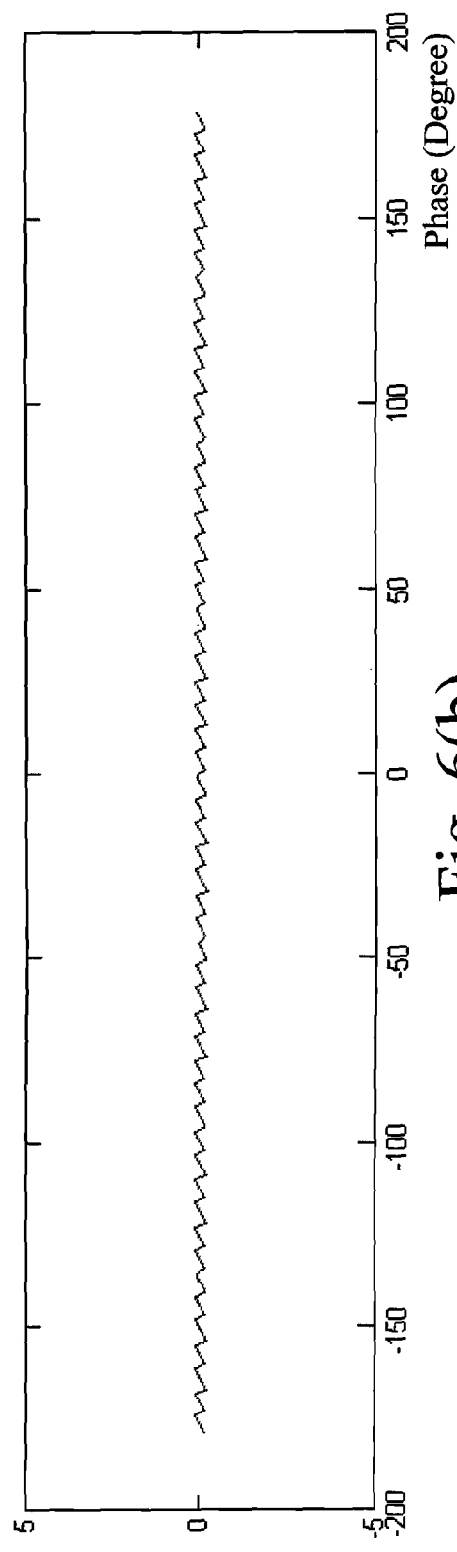
FIG. 6(b) is a schematic diagram showing a change of a phase estimate error in degree obtained from the DPD configuration according to the change of the phase of the input signal.
Figure 7A:
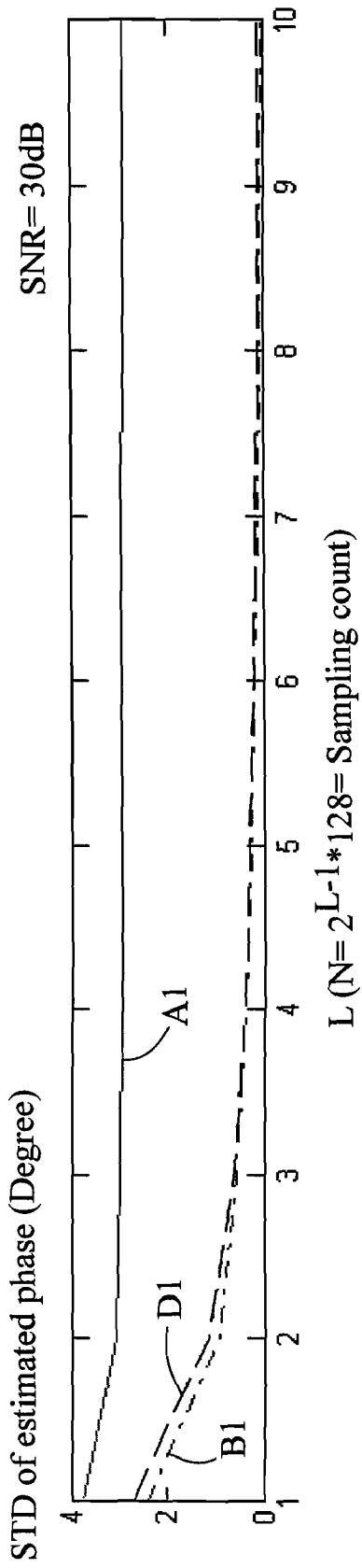
FIG. 7(a), FIG. 7(b), FIG. 7(c), FIG. 7(d), FIG. 7(e), FIG. 7(f), FIG. 7(g) and FIG. 7(h) are schematic diagrams showing changes of standard deviations of estimated phases in degree obtained from the APD device and the DPD and the NB-DPD configurations according to a change of a sampling count in eight respective SNRs of 30 dB, 20 dB, 10 dB, 5 dB, 0 dB, −5 dB, −10 dB and −20 dB.
Figure 7B:
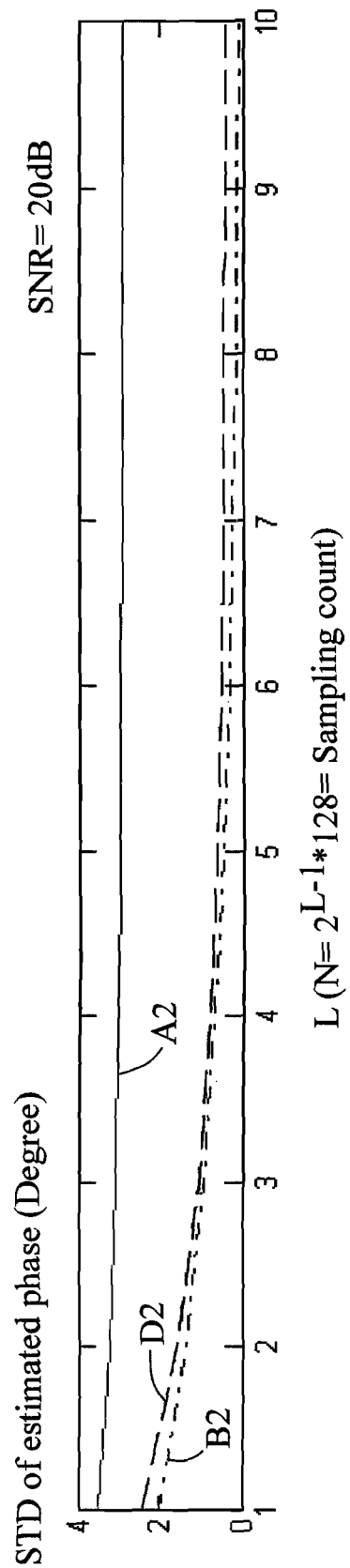
Figure 7C:
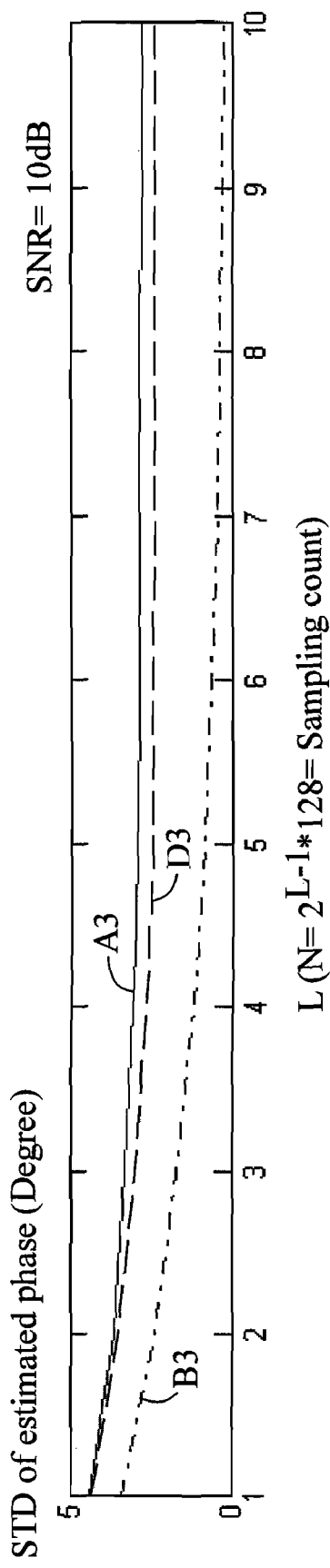
Figure 7D:
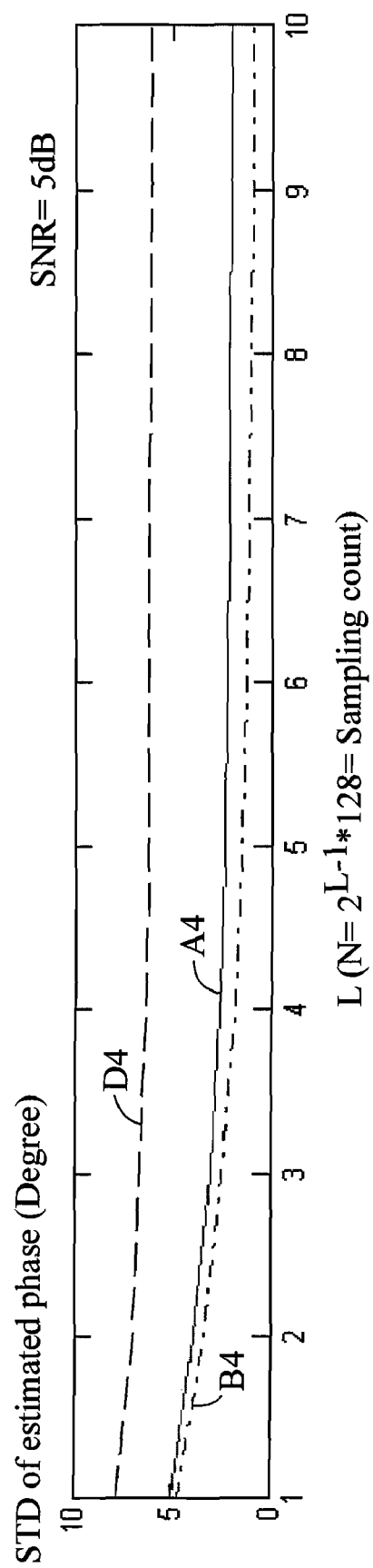
Figure 7E:
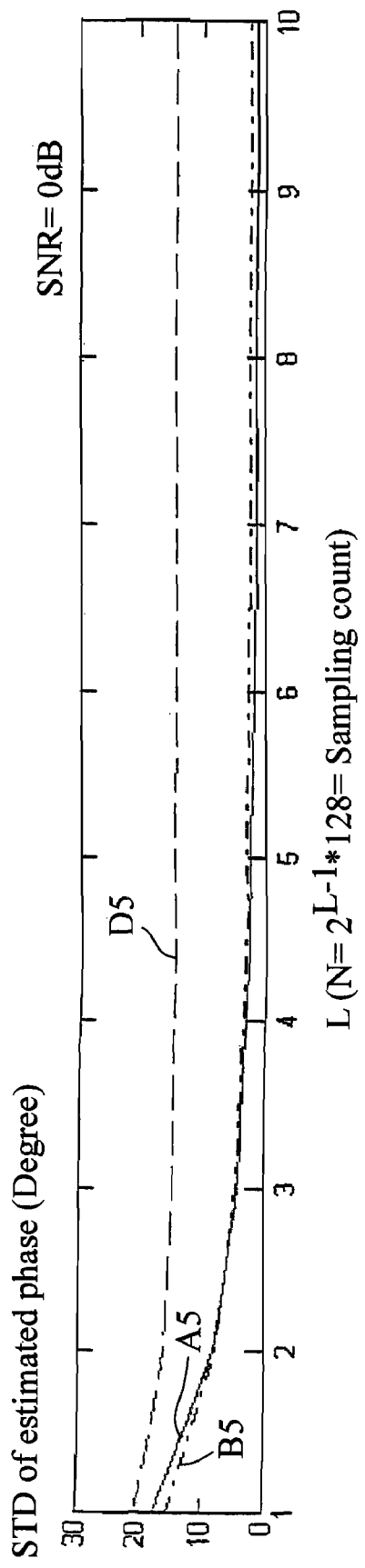
Figure 7F:
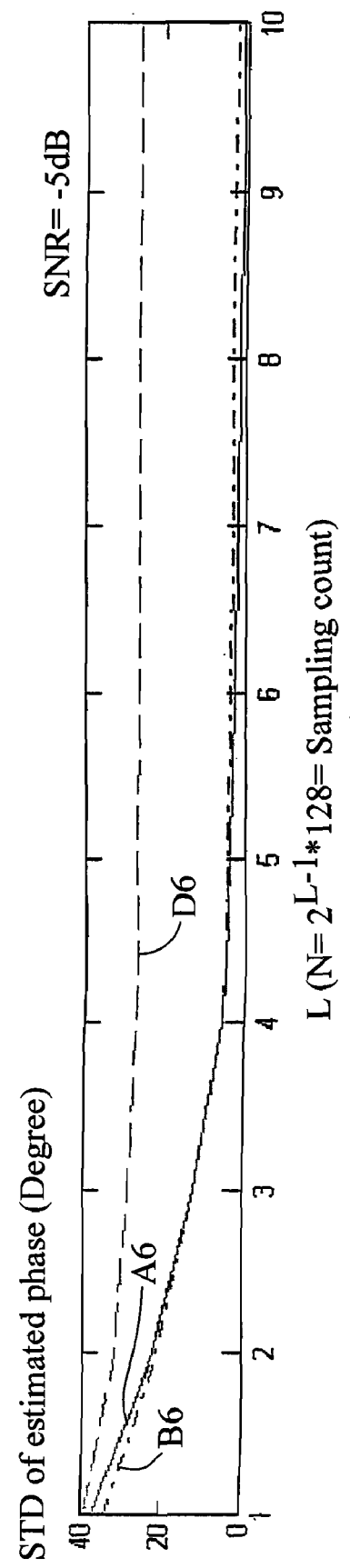
Figure 7G:
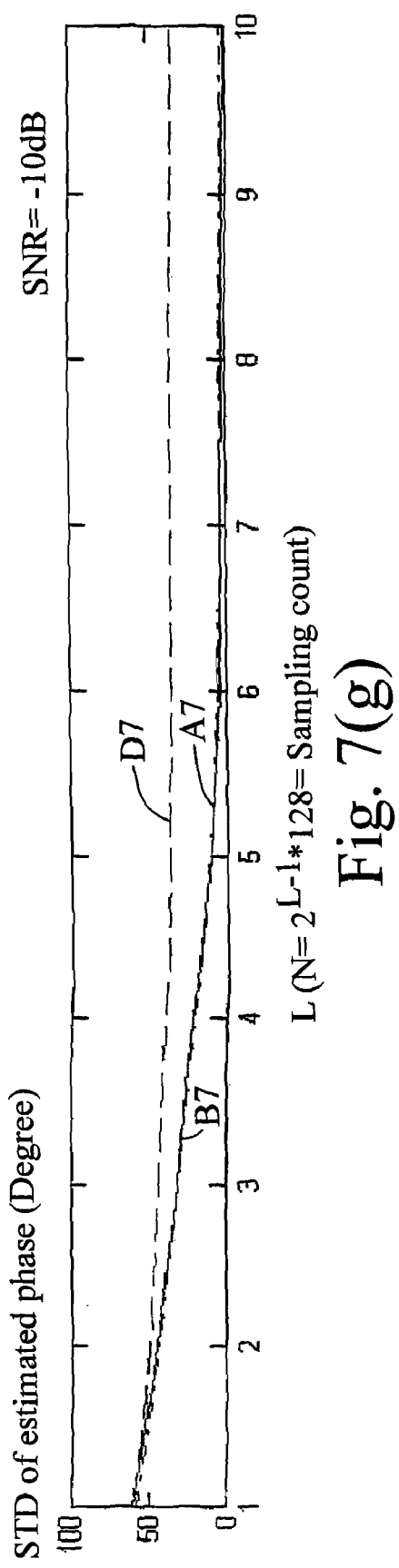
Figure 7H:
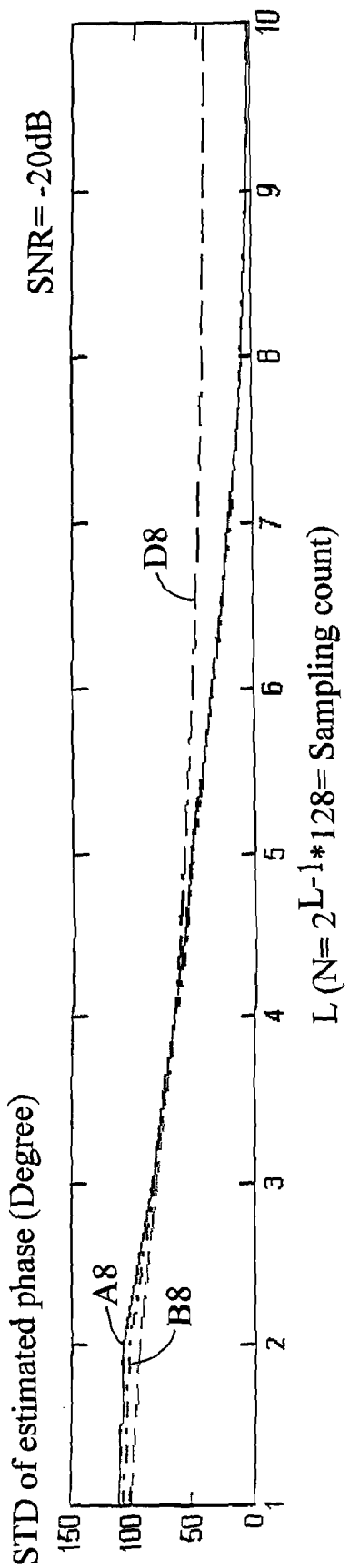

Please refer to FIG. 6(a) and FIG. 6(b). FIG. 6(a) is a schematic diagram showing a change of a phase-estimate error in degree obtained from the APD device 10 according to a change of the phase of the input signal $S_1$, and FIG. 6(b) is a schematic diagram showing a change of a phase estimate error in degree obtained from the DPD configuration 311 according to the change of the phase of the input signal $S_2$. FIG. 6(a) and FIG. 6(b) are drafted under the conditions that the observation time is 1 msec (equal to $NT_S$, where N is the sampling count and $T_S$ is the sampling period), the carrier frequency $f_C$ is 15.42 MHz, and the sampling count N is 8192. As shown, in general, the phase estimate error of the DPD configuration 311 is much less than that of the APD device 10. Besides, the phase estimate errors of both the APD device 10 and the DPD configuration 311 exhibit periodic property; the transient variation via the phase reduces when the sampling count N increases.

Please refer to FIGS. 7(a), 7(b), 7(c), 7(d), 7(e), 7(f), 7(g) and 7(h), which are schematic diagrams showing changes of standard deviations (STDs) of the estimated phases in degree obtained from the APD device 10, the DPD configuration 311 and the NB-DPD configuration 312 according to a change of the sampling count N in eight respective SNRs of 30 dB, 20 dB, 10 dB, 5 dB, 0 dB, −5 dB, −10 dB and −20 dB. FIGS. 7(a), 7(b), 7(c), 7(d), 7(e), 7(f), 7(g) and 7(h) are drafted under the conditions that the carrier frequency $f_C$ is 15.42 MHz, and the sampling count (Number of total samples) N includes 128, 512 . . . and 65536. As shown, the STD curves A1, A2, A3 and A4 are obtained from the APD device 10, the STD curves D1, D2, D3 and D4 are obtained from the DPD configuration 311, and the STD curves B1, B2, B3 and B4 are obtained from the NB-DPD configuration 312. The NB-DPD configuration 312 avoids the significant loss in one-bit quantization; when SNR is high or noiseless, the phase error of the NB-DPD configuration 312 is much less than that of the APD device 10; the higher the SNR is, the greater the improvement is. Also, the NB-DPD configuration 312 performs generally better than the DPD configuration 311 in noisy cases; the lower the SNR is, the greater the improvement is; i.e. the NB-DPD configuration 312 is equivalent to the DPD configuration 311 in noiseless cases and much more robust than the DPD configuration 311 in noisy environments.

The phase-discriminating device 30 has the following features in comparison with the APD device 10. The accuracy is high when the SNR is larger than 2.6 dB. The computations of the DPD configuration 311 and the NB-DPD configuration 312 are linear unlike the nonlinear $\tan^{-1}(Q_A/I_A)$ computation of the APD device 10. The processing load reduces due to the adoption of the one-bit signal processing, which reduces the complexity, the consumed power and the memory storage. The current multiple-bit scheme of the conventional phase-discriminating device for obtaining the estimated phase can be simply updated by taking sign bit. Besides, the phase-discriminating device 30 neglects the AGC. When the SNR is smaller than 2.6 dB, the accuracy of the NB-DPD configuration 312 is equivalent to that of the APD device 10, but the computation of the NB-DPD configuration 312 is much less than that of the APD device 10.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A phase-discriminating device, comprising:
    a phase-discriminating unit converting an input and a reference signals into an input and a reference sequences respectively by a one-bit A/D conversion operation, determining a first value $A_P$, an in-phase component $I_P$ and a quadrature component $Q_P$ of the input signal in response to the input and the reference sequences, and producing an estimated phase of the input signal according to a relation among the first value $A_P$, the in-phase component $I_P$ and a polarity of the quadrature component $Q_P$, wherein the relation is defined by a first formula (sgn[$Q_P$]·$(1-I_P/A_P)$), the sgn[$Q_P$] denotes a polarity function, the estimated phase is proportional to the first formula (sgn[$Q_P$]·$(1-I_P/A_P)$) and the first value $A_P$ is a certain integer being one of:
    a first integer being a sample size of the one-bit A/D conversion operation for producing the input sequence; and
    a second integer being a summation of an absolute value of the in-phase component $I_P$ and an absolute value of the quadrature component $Q_P$.

2. A phase-discriminating device according to claim 1, wherein:
    the input signal has a carrier frequency; and
    the reference signal includes an in-phase and a quadrature reference waves, wherein each of the in-phase and the quadrature reference waves has the carrier frequency.

3. A phase-discriminating device according to claim 2, wherein the first value $A_P$ is the first integer, and the phase-discriminating unit comprises:
    a determining unit converting the input and the reference signals into the input and the reference sequences respectively by the one-bit A/D conversion operation, and determining the first value $A_P$, the in-phase component $I_P$ and the quadrature component $Q_P$ in response to the input and the reference sequences; and
    a phase-estimating unit electrically connected to the determining unit, calculating a second value equal to (sgn[$Q_P$]·$(1-I_P/A_P)/2$), and multiplying the second value by $\pi$ to produce the estimated phase.

4. A phase-discriminating device according to claim 2, wherein the first value $A_P$ is the second integer, and the phase-discriminating unit comprises:
   a determining unit converting the input and the reference signals into the input and the reference sequences respectively by the one-bit A/D conversion operation, and determining the in-phase component $I_P$ and the quadrature component $Q_P$ in response to the input and the reference sequences; and
   a phase-estimating unit electrically connected to the determining unit, calculating the second integer, calculating a second value equal to $(\mathrm{sgn}[Q_P]\cdot(1-I_P/A_P)/2)$, and multiplying the second value by n to produce the estimated phase.

5. A phase-discriminating device, comprising:
   a phase-discriminating unit processing an input signal by a one-bit A/D conversion operation to determine a first value $A_P$, an in-phase component $I_P$ and a quadrature component $Q_P$ of the input signal, and producing an estimated phase of the input signal according to a relation among the first value $A_P$, the in-phase component $I_P$ and a polarity of the quadrature component $Q_P$, wherein the relation is defined by a first formula $(\mathrm{sgn}[Q_P]\cdot(1-I_P/A_P))$, the $\mathrm{sgn}[Q_P]$ denotes a polarity function, the first value $A_P$ is associated with a signal-to-noise ratio of the input signal, and the estimated phase is proportional to the first formula $(\mathrm{sgn}[Q_P]\cdot(1-I_P/A_P))$.

6. A phase-discriminating device according to claim 5, wherein:
   the phase-discriminating unit determines a reference signal according to the input signal, converts the input and the reference signals into an input and a reference sequences respectively by the one-bit A/D conversion operation, and determines the first value $A_P$, the in-phase component $I_P$ and the quadrature component $Q_P$ in response to the input and the reference sequences;
   the input signal has a carrier frequency;
   the reference signal includes an in-phase and a quadrature reference waves, wherein each of the in-phase and the quadrature reference waves has the carrier frequency;
   the reference sequence includes an in-phase and a quadrature reference sequences; and
   each of the input, the in-phase and the quadrature reference sequences has a high and a low bit values being 1 and −1 respectively.

7. A phase-discriminating device according to claim 6, wherein the signal-to-noise ratio is larger than 10 dB, the first value $A_P$ is an integer being a sample size of the one-bit A/D conversion operation for producing the input sequence, and the phase-discriminating unit comprises:
   a determining unit converting the input and the reference signals into the input and the reference sequences respectively by the one-bit A/D conversion operation, and determining the first value $A_P$, the in-phase component $I_P$ and the quadrature component $Q_P$ in response to the input and the reference sequences; and
   a phase-estimating unit electrically connected to the determining unit, calculating a second value equal to $(\mathrm{sgn}[Q_P]\cdot(1-I_P/A_P)/2)$, and multiplying the second value by $\pi$ to produce the estimated phase.

8. A phase-discriminating device according to claim 7, wherein the determining unit comprises:
   an A/D converter receiving the input signal, determining the reference signal according to the input signal, and sampling the input signal and the in-phase and the quadrature reference waves by a number of times equal to the sample size of the one-bit A/D conversion operation to respectively produce the input, the in-phase and the quadrature reference sequences;
   a first XOR gate producing a first sequence having corresponding bit values in response to the input and the in-phase reference sequences;
   a second XOR gate producing a second sequence having corresponding bit values in response to the input and the quadrature reference sequences;
   a first counter device accumulating the corresponding bit values of the first sequence to produce the in-phase component $I_P$; and
   a second counter device accumulating the corresponding bit values of the second sequence to produce the quadrature component $Q_P$.

9. A phase-discriminating device according to claim 7, wherein the phase-estimating unit comprises:
   an addition circuit receiving the in-phase component $I_P$ and the sample size from the determining unit, and subtracting the in-phase component $I_P$ from the sample size to produce a third value;
   a first multiplication circuit receiving the sample size, and multiplying the sample size by 2 to produce a fourth value;
   a division circuit receiving the third value and the fourth value, and dividing the third value by the fourth value to produce a fifth value;
   a polarity determining circuit receiving the quadrature component $Q_P$, and producing a sixth value of the sgn $[Q_P]$;
   a second multiplication circuit receiving the fifth value and the sixth value, and multiplying the fifth value by the sixth value to produce the second value; and
   a third multiplication circuit receiving the second value, and multiplying the second value by $\pi$ to produce the estimated phase.

10. A phase-discriminating device according to claim 6, wherein the first value $A_P$ is an integer being a summation of an absolute value of the $I_P$ and an absolute value of the $Q_P$, and the phase-discriminating unit comprises:
    a determining unit converting the input and the reference signals into the input and the reference sequences respectively by the one-bit A/D conversion operation, and determining the in-phase component $I_P$ and the quadrature component $Q_P$ in response to the input and the reference sequences; and
    a phase-estimating unit electrically connected to the determining unit, calculating the first value $A_P$, calculating a second value equal to $(\mathrm{sgn}[Q_P]\cdot(1-I_P/A_P)/2)$, and multiplying the second value by n to produce the estimated phase.

11. A phase-discriminating device according to claim 10, wherein the determining unit comprises:
    an A/D converter receiving the input signal and the in-phase and the quadrature reference waves, and sampling the input signal and the in-phase and the quadrature reference waves by a number of times equal to a sample size of the one-bit A/D conversion operation to respectively produce the input, the in-phase and the quadrature reference sequences;
    a first XOR gate producing a first sequence having corresponding bit values in response to the input and the in-phase reference sequences;
    a second XOR gate producing a second sequence having corresponding bit values in response to the input and the quadrature reference sequences;

a first counter device accumulating the corresponding bit values of the first sequence to produce the in-phase component $I_P$; and a second counter device accumulating the corresponding bit values of the second sequence to produce the quadrature component $Q_P$.

12. A phase-discriminating device according to claim 10, wherein the phase-estimating unit comprises:
a first operation circuit producing a third and a fourth values in response to the in-phase component $I_P$;
a second operation circuit producing the second value in response to the quadrature component $I_Q$ and the third and the fourth values; and
a first multiplication circuit receiving the second value, and multiplying the second value by $\pi$ to produce the estimated phase.

13. A phase-discriminating device according to claim 12, wherein the first operation circuit comprises:
a polarity determining circuit receiving the in-phase component $I_P$, and producing a fifth value of the $sgn[I_P]$;
an NOT gate receiving the fifth value, and producing a sixth value;
an absolute-value determining circuit receiving the in-phase component $I_P$, and calculating an absolute value of the in-phase component $I_P$ to produce the third value; and
a multiplication circuit receiving the third value and the sixth value, and multiplying the third value by the sixth value to produce the fourth value.

14. A phase-discriminating device according to claim 12, wherein the second operation circuit comprises:
an absolute-value determining circuit receiving the quadrature component $Q_P$, and calculating an absolute value of the quadrature component $Q_P$ to produce a fifth value;
a first addition circuit receiving the third value and the fifth value, and adding the third value and the fifth value to produce the first value $A_P$;
a second addition circuit receiving the fourth value and the first value $A_P$, and adding the fourth value and the first value $A_P$ to produce a sixth value;
a first multiplication circuit receiving the first value $A_P$, and multiplying the first value $A_P$ by 2 to produce a seventh value;
a division circuit receiving the sixth value and the seventh value, and dividing the sixth value by the seventh value to produce an eighth value;
a polarity determining circuit receiving the quadrature component $Q_P$, and producing a ninth value of the sgn $[Q_P]$; and
a second multiplication circuit receiving the eighth value and the ninth value, and multiplying the eighth value by the ninth value to produce the second value.

15. A phase-discriminating method, comprising steps of:
(a) processing an input signal by a one-bit A/D conversion operation to determine a first value $A_P$, an in-phase component $I_P$ and a quadrature component $Q_P$ of the input signal; and
(b) producing an estimated phase of the input signal according to a relation among the first value $A_P$, the in-phase component $I_P$ and a polarity of the quadrature component $Q_P$, wherein the relation is defined by a first formula $(sgn[Q_P] \cdot (1-I_P/A_P))$, the $sgn[Q_P]$ denotes a polarity function, the first value $A_P$ is associated with a signal-to-noise ratio of the input signal, and the estimated phase is proportional to the first formula $(sgn[Q_P] \cdot (1-I_P/A_P))$.

16. A phase-discriminating method according to claim 15, wherein the step (a) further comprises sub-steps of:
(c) determining a reference signal according to the input signal;
(d) converting the input and the reference signals into an input and a reference sequences respectively by a one-bit A/D conversion operation;
(e) determining the first value $A_P$, the in-phase component $I_P$ and the quadrature component $Q_P$ in response to the input and the reference sequences, wherein:
the input signal has a carrier frequency;
the reference signal includes an in-phase and a quadrature reference waves, wherein each of the in-phase and the quadrature reference waves has the carrier frequency;
the reference sequence includes an in-phase and a quadrature reference sequences; and
each of the input, the in-phase and the quadrature reference sequences has a high and a low bit values being 1 and $-1$ respectively.

17. A phase-discriminating method according to claim 16, wherein the signal-to-noise ratio is larger than 10 dB, the first value $A_P$ is an integer being a sample size of the one-bit A/D conversion operation for producing the input sequence, and the step (d) further comprises a sub-step of:
sampling the input signal and the in-phase and the quadrature reference waves by a number of times equal to the sample size of the one-bit A/D conversion operation to respectively produce the input, the in-phase and the quadrature reference sequences; and
the step (e) further comprises sub-steps of:
multiplying the input sequence by the in-phase reference sequence to produce a first sequence having corresponding bit values;
multiplying the input sequence by the quadrature reference sequence to produce a second sequence having corresponding bit values;
accumulating the corresponding bit values of the first sequence to produce the in-phase component $I_P$; and
accumulating the corresponding bit values of the second sequence to produce the quadrature component $Q_P$.

18. A phase-discriminating method according to claim 17, wherein the step (b) further comprises sub-steps of:
calculating a second value equal to $(sgn[Q_P] \cdot (1-I_P/A_P)/2)$; and
multiplying the second value by $\pi$ to produce the estimated phase.

19. A phase-discriminating method according to claim 17, wherein:
the first sequence includes a plurality of bit values;
the step (e) further comprises a sub-step of counting an amount of how many the plurality of bit values equal to the low bit value;
the first formula divided by 2, $(sgn[Q_P] \cdot (1-I_P/A_P)/2)$, is equivalent to a second formula $(sgn[Q_P] \cdot (B_P/A_P))$; and
the $B_P$ is the amount.

20. A phase-discriminating method according to claim 16, wherein the first value $A_P$ is an integer being a summation of an absolute value of the $I_P$ and an absolute value of the $Q_P$, and the step (b) further comprises sub-steps of:
calculating a second value equal to $(sgn[Q_P] \cdot (1-I_P/A_P)/2)$; and
multiplying the second value by $\pi$ to produce the estimated phase.

* * * * *

UNITED STATES PATENT AND TRADEMARK OFFICE
CERTIFICATE OF CORRECTION

PATENT NO.       : 8,238,506 B2                                    Page 1 of 1
APPLICATION NO.  : 12/349141
DATED            : August 7, 2012
INVENTOR(S)      : Chang et al.

It is certified that error appears in the above-identified patent and that said Letters Patent is hereby corrected as shown below:

Claim 10, column 10, line 49, change "by n" to -- by $\pi$ --

Signed and Sealed this
Twenty-second Day of January, 2013

David J. Kappos
*Director of the United States Patent and Trademark Office*